(12) United States Patent
Valentin (10) Patent No.: US 10,424,431 B2
(45) Date of Patent: Sep. 24, 2019

(54) COIL, INDUCTOR DEVICE AND METHOD FOR MANUFACTURING THE COIL

(71) Applicant: Xytech Electronic Technology (Shanghai) Co., Ltd., Shanghai (CN)

(72) Inventor: Raphaël Jacques Valentin, Shanghai (CN)

(73) Assignee: XYTECH ELECTRONIC TECHNOLOGY (SHANGHAI) CO., LTD., Shanghai (CN)

(*) Notice: Subject to any disclaimer, the term of this patent is extended or adjusted under 35 U.S.C. 154(b) by 129 days.

(21) Appl. No.: 15/264,585

(22) Filed: Sep. 13, 2016

(65) Prior Publication Data

US 2017/0076853 A1 Mar. 16, 2017

(30) Foreign Application Priority Data

Sep. 15, 2015 (CN) .......................... 2015 1 0587257

(51) Int. Cl.
*H01F 27/29* (2006.01)
*H01F 27/28* (2006.01)
*H01F 41/04* (2006.01)
*H01L 49/02* (2006.01)
*H05K 1/16* (2006.01)

(52) U.S. Cl.
CPC ....... *H01F 27/2804* (2013.01); *H01F 41/041* (2013.01); *H01L 28/10* (2013.01); *H05K 1/165* (2013.01); *H01F 2027/2809* (2013.01)

(58) Field of Classification Search
CPC .. H01F 27/2804; H01F 27/2809; H01F 27/29; H01F 2027/2809; H01F 41/041; H01F 17/0006; H01F 17/0013; H01F 2017/002; H01F 2017/0046; H01F 2017/0073; H01L 28/10; H05K 1/165
USPC ................. 336/223, 192, 200, 147; 29/602.1
See application file for complete search history.

(56) References Cited

U.S. PATENT DOCUMENTS

| | | | | |
|---|---|---|---|---|
| 4,313,152 | A * | 1/1982 | Vranken | H01F 5/003 336/200 |
| 5,363,081 | A * | 11/1994 | Bando | H01F 17/0006 29/602.1 |
| 5,656,849 | A | 8/1997 | Burghartz et al. | |
| 6,175,293 | B1 * | 1/2001 | Hasegawa | H01F 1/15308 336/150 |
| 6,417,755 | B1 | 7/2002 | Liu | |
| 6,534,406 | B1 | 3/2003 | Howard | |
| 7,370,403 | B1 | 5/2008 | Hsu | |
| 7,489,220 | B2 | 2/2009 | Baumgartner | |
| 7,782,166 | B2 | 8/2010 | Loke et al. | |
| 8,279,036 | B2 | 10/2012 | Banno | |
| 8,441,333 | B2 | 5/2013 | Chiu | |

(Continued)

*Primary Examiner* — Mang Tin Bik Lian
(74) *Attorney, Agent, or Firm* — Perkins Coie LLP (57) ABSTRACT

A coil comprises a plurality of conductive layers, wherein a first conductive layer and a second conductive layer of the plurality of conductive layers each comprises a winding, and the first conductive layer is adjacent to the second conductive layer; wherein a first winding on the first conductive layer is electrically connected to a second winding on the second conductive layer, a first end of the first winding is connected to a first terminal electrode, and a second end on the second winding is connected to a second terminal electrode; wherein geometric central points of the first winding and the second winding are not spatially aligned.

10 Claims, 8 Drawing Sheets

(56) References Cited

U.S. PATENT DOCUMENTS

| | | |
|---|---|---|
| 8,754,736 B2 | 6/2014 | Groves et al. |
| 8,941,212 B2 | 1/2015 | Yen et al. |
| 2005/0104158 A1 | 5/2005 | Bhattacharjee et al. |
| 2007/0001796 A1 | 1/2007 | Waffenschmidt et al. |
| 2007/0205856 A1* | 9/2007 | Matsunaga ......... H01F 17/0013 336/200 |
| 2011/0133877 A1 | 6/2011 | Chiu |
| 2012/0249276 A1 | 10/2012 | Fontana |
| 2013/0106554 A1 | 5/2013 | Girard et al. |
| 2014/0285307 A1* | 9/2014 | Ishida ................ H01F 17/0013 336/200 |
| 2015/0243430 A1* | 8/2015 | Chang .................... H01F 5/003 336/200 |
| 2015/0364241 A1* | 12/2015 | Groves ................ H01F 41/041 336/200 |

\* cited by examiner

COIL, INDUCTOR DEVICE AND METHOD FOR MANUFACTURING THE COIL

CLAIM OF PRIORITY

This application claims priority to Chinese Application number entitled "Coil, inductor device and method for manufacturing the coil of inductive device," with filing number of 201510587257.6 filed on Sep. 15, 2015 by Xytech Electronic Technology (Shanghai) Co., Ltd., which is incorporated herein by reference.

TECHNICAL FIELD

The present invention relates to the technical field of electronic devices used in an electronic circuit, specifically to a coil, inductor device and method for manufacturing the coil of inductive device.

BACKGROUND

An inductor is a common device in an electronic circuit, and a spiral inductor used in a semiconductor Integrated Circuit (IC) or in a printed circuit board (PCB) comprises at least a winding of conductive wires. Along with development of the integrated circuit technology, the inductive devices are generally prepared by adopting one conductive layer or a plurality of conductive layers. Because a winding using one conductive layer ordinarily occupies a large chip area, a winding using the plurality of conductive layers can be applied in designing an inductive device. However, inductive devices based on a winding using the plurality of conductive layers reveal some critical shortcomings with regards to the self-resonance frequency and the Q-factor.

Conventional spiral stacked inductor winding includes a single or a plurality of conductive loops forming a shape of a coil disposed in a multi-layer structure. In the multi-layer structure, each layer generally includes at least one loop. Generally, the plurality of loops of each layer is electrically connected to an underpass contact through a metal filled vias in the insulating layer.

Figure 4:
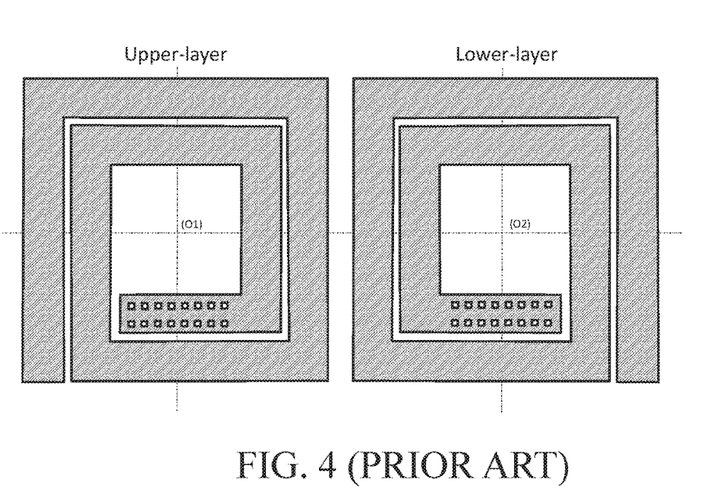
FIG. 4 shows the plan views of the upper-layer and the lower layer layout used for making a four-turn inductor coil accordance with the prior art.

However, generally, in the multi-layer spiral inductor winding, as shown in FIG. 4, the upper and lower nested conductive spiral layers are aligned with each other, and the nested conductive spiral loops disposed on each layer is continuous. The conductive loop on the upper layer is electrically connected to the conductive loop on the lower layer using metal filled vias. Two terminal electrodes are respectively located at the endpoints of the outer loops of the upper and lower layers, thereby may affecting the performance of the inductor such as the self-resonance frequency and the Q-factor.

SUMMARY

Embodiments of the invention advantageously may provide a winding, inductor and method for manufacturing winding of inductive device featuring high inductance value and jointly a high self-resonance frequency and a high Q-factor value.

According to an embodiment of the invention, an asymmetric coil comprises a plurality of conductive layers, wherein at least two conductive layers of the plurality of conductive layers each comprises a winding; wherein a first winding on a first conductive layer of the at least two conductive layers is electrically connected to a second winding on a second conductive layer of the at least two conductive layers, wherein the shapes of each conductive loop of the first winding and the second winding are spiral, one of the first winding and the second winding comprises a plurality of conductive loops, and the other one of the first winding and the second winding comprises at least one conductive loop; each loop includes two end-sections; a first end-section of a first outer loop of the asymmetric coil is connected to a first terminal electrode, and a second end-section of a first inner loop of the asymmetric coil is connected to a second terminal electrode; wherein each end section of the conductive loop of the winding on the first conductive layer is connected via at least one plug or at least one metal-filled via hole to each corresponding end section of the conductive loop of the winding of the second conductive layer when the end sections of the conductive loop of the winding on the first conductive layer is facing the corresponding end sections of the conductive loop of the winding on the second conductive layer; and wherein geometric central points of the first winding and the second winding are not spatially aligned.

Alternatively or additionally, each loop is electrically insulated from one another using an insulating material Alternatively or additionally, at least the first conductive layer further comprises a single section trace placed in parallel with and inter-connected to a first terminal section of the outmost loop of the second conductive layer using at least one plug or at least one metal-filled via hole.

Alternatively or additionally, the asymmetric coil comprises a conductive bridge configured to connect the first end-section of a first outer loop of the asymmetric coil to the first terminal electrode, or to connect the second end-section of a first inner loop of the asymmetric coil to the second terminal electrode.

Alternatively or additionally, wherein the asymmetric coil comprises a plurality of conductive loops, and the plurality of conductive loops are in a similar shape of square, blended square, octagon, polygon, circle or simple closed curve, wherein the inner trace of loop flips over the outer trace of the spiral loop.

Alternatively or additionally, wherein the first winding comprises N conductive loops and the second winding comprises N, N−1 or N+1 conductive loops.

Alternatively or additionally, wherein the first winding or the second winding comprises a plurality of conductive loops, wherein a width of the conductive loop is different from each other.

An embodiment of the invention discloses an inductor device comprising wherein the plurality of asymmetric coils are connected in series to form an inductive device.

An embodiment of the invention discloses an integrated circuit comprising at least one inductor device as discussed above.

An embodiment of the invention discloses an integrated circuit comprising a plurality of coils as discussed above.

Alternatively or additionally, an inductor winding according to an embodiment of the invention at least comprises a plurality of conductive layers, wherein at least two conductive layers of the plurality of conductive layers comprises at least one conductive spiral loop and each distinct conductive spiral loop is electrically connected to form a winding, and wherein a first terminal electrode of the winding is electrically connected to an outer spiral loop and a second terminal electrode of the winding is electrically connected to an inner spiral loop; and wherein two adjacent conductive layers of the winding whose the geometric central points of the spiral loops are not spatially aligned with each other. The outer loop and the inner loop can be included in different layers.

And the conductive loop can be spiral loops and the width of the loops can be different from each other.

Alternatively or additionally, wherein at least one layer can contain a bridge, wherein the bridge is configured to connect the inner spiral loop of the corresponding layer to the second terminal electrode. The aforesaid layer can contain a plurality of conductive loops or not.

Alternatively or additionally, the winding may comprise two conductive layers, wherein each conductive layer comprises at least one conductive spiral loop; and each distinct conductive spiral loop is electrically connected to form a winding; and wherein a first terminal electrode is electrically connected to an outer spiral loop of a first layer and a second terminal electrode is electrically connected to an inner spiral loop of a second conductive layer which is adjacent to the first conductive layer; and wherein the two adjacent conductive layers whose the geometric central points of the spiral loops are not spatially aligned with each other.

Alternatively or additionally, the winding further comprises a third layer, which contains a bridge configured to connect the inner spiral loop of the second layer to the second terminal electrode.

Alternatively or additionally, the second layer of the winding further comprises a bridge that connects the inner spiral loop of the second layer to the second terminal electrode.

Alternatively or additionally, the conductive spiral loops of the winding are in a similar shape of square, blended square, octagon, polygon, circle or simple closed curve, wherein the inner trace of spiral loop flips over the outer trace of the spiral loop.

Alternatively or additionally, one layer of the winding comprises N conductive loops and its adjacent layer comprises N or N−1 or N+1 conductive loops.

Alternatively or additionally, each of the conductive spiral loops of the winding is divided into a plurality of conductive section traces, wherein a last end section trace of the conductive loop and a first end section trace of the conductive loop form a second group and the remaining section traces of the conductive loop form a first group. The widths of the section traces of a conductive spiral loop are not completely uniform along the conductive spiral loop.

Alternatively or additionally, at least an end section trace of the second group of a conductive loop of the first layer is electrically connected to at least one end section of the second group of a conductive loop of the second layer. In addition, a current flowing through each electrical connection is alternating successively from the first layer to the second layer and from the second layer to the first layer.

Alternatively or additionally, the section traces of the conductive loops of the first layer and the second conductive layer are connected together at the two end section traces of the conductive spiral loops, and are positioned facing each other.

Alternatively or additionally, each conductive spiral loop is electrically insulated with each other through an insulating material (or also called insulator or isolated material), and each distinct conductive spiral loop is interconnected together using conductive metal-filled via plugs, and the first or/and the last end section traces are used to interconnect metal-filled vias.

Alternatively or additionally, the section traces of the first group share a first width while the section traces of the second group share a second width, wherein the second width is narrower than the first width.

Alternatively or additionally, the section traces of the first group of each conductive spiral loop of the first conductive layer are face to face with the section traces of the first group of each conductive spiral loops of the second conductive layer, positioned facing each other.

Alternatively or additionally, a first terminal electrode is connected to the first end section trace of outer spiral loop of the first layer and a second terminal electrode is connected to the last end section trace of inner spiral loop of the second layer.

Alternatively or additionally, the winding is formed using a plurality of conductive spiral loops, wherein each conductive spiral loop has different widths.

An inductor device according to an embodiment of the invention comprises a plurality of windings as described above, wherein the plurality of coils are connected together in series in order to form a single inductive device.

According to another embodiment of the invention, a circuit comprises at least one inductor device or a plurality of coils as describe above.

According to another embodiment of the invention, an integrated circuit comprises a plurality of asymmetric coils as discussed above.

According to another embodiment of the invention, a method of preparing an asymmetric coil, comprising forming a plurality of conductive layers, wherein at least two conductive layers of the plurality of conductive layers each comprises a winding; wherein electrically connecting a first winding on a first conductive layer of the at least two conductive layers to a second winding on a second conductive layer of the at least two conductive layers; the shapes of each conductive loop of the first winding and the second winding are spiral, one of the first winding and the second winding comprises a plurality of conductive loops, and the other one of the first winding and the second winding comprises at least one conductive loop; each loop includes two end-sections; connecting a first end-section of a first outer loop of the asymmetric coil to a first terminal electrode, and connecting a second end-section of a first inner loop of the asymmetric coil to a second terminal electrode; wherein each end section of the conductive loop of the winding on the first conductive layer is connected via at least one plug or at least one metal-filled via hole to each corresponding end section of the conductive loop of the winding of the second conductive layer when the end sections of the conductive loop of the winding on the first conductive layer is facing the corresponding end sections of the conductive loop of the winding on the second conductive layer; and wherein geometric central points of the first winding and the second winding are not spatially aligned.

Alternatively or additionally, each of the first winding and the second winding further comprises a plurality of conductive loops, and the method further comprises isolating the plurality of conductive loops from one another using an insulating material; and forming the coil on a substrate by connecting conductive loops of adjacent conductive layers, wherein the substrate comprises a semiconductor substrate or a Printed Circuit Board (PCB).

In view of the above, the inductor winding according to an embodiment of the invention has the advantage of high inductance, reduced parasitic coupling capacitance, high self-resonance frequency and high Q-factor.

DETAILED DESCRIPTION OF THE EMBODIMENTS

The implementations of embodiments of the invention are illustrated through specific embodiments, and persons skilled in the art may easily understand other advantages and efficacies of embodiments of the invention through the content disclosed in the specifications.

Referring to FIG. 1 to FIG. 9, it should be noted that, the structures, the scales, the sizes, like shown in the drawings, are only used for illustrating the embodiments, which should be appreciated by persons skilled in the art, instead of limiting the implementation conditions of embodiments of the invention. Any modification in structure, change in scale, or adjustment in size should fall within the scope of the technical content disclosed by the embodiments of the invention without influencing the generated efficacy and achieved objective of embodiments of the invention. Meanwhile, some words such as "upper," "lower," "left," "right," "middle," and "a" or "an" quoted in the specification are only used for clarify the illustration, instead of limiting the implementation scope of the embodiments of present invention. Further, any changes or adjustments of relative relationships should be considered as falling within the scope of implementation of embodiments of the invention without essentially changing the technical content.

A coil provided in embodiments of the invention includes a plurality of layers; except that one layer can contain a bridge, and each of the remaining layer includes at least one conductive loop.

Alternatively, each of the plurality of layers includes a winding. The winding comprises at least one conductive loop. One layer of the plurality of layers further includes a bridge. The conductive loops are electrically connected to form a coil. A first terminal electrode 10 of a winding comprises an outer spiral loop and a second terminal electrode 11 of the winding comprises an inner spiral loop. The inner loop and outer loop may be located in different layers (for example, the outer loop is the outmost conductive loop of one layer, for example, the upper layer, and the inner loop is the innermost conductive loop of another layer, for example, the middle layer).

Figure 2:
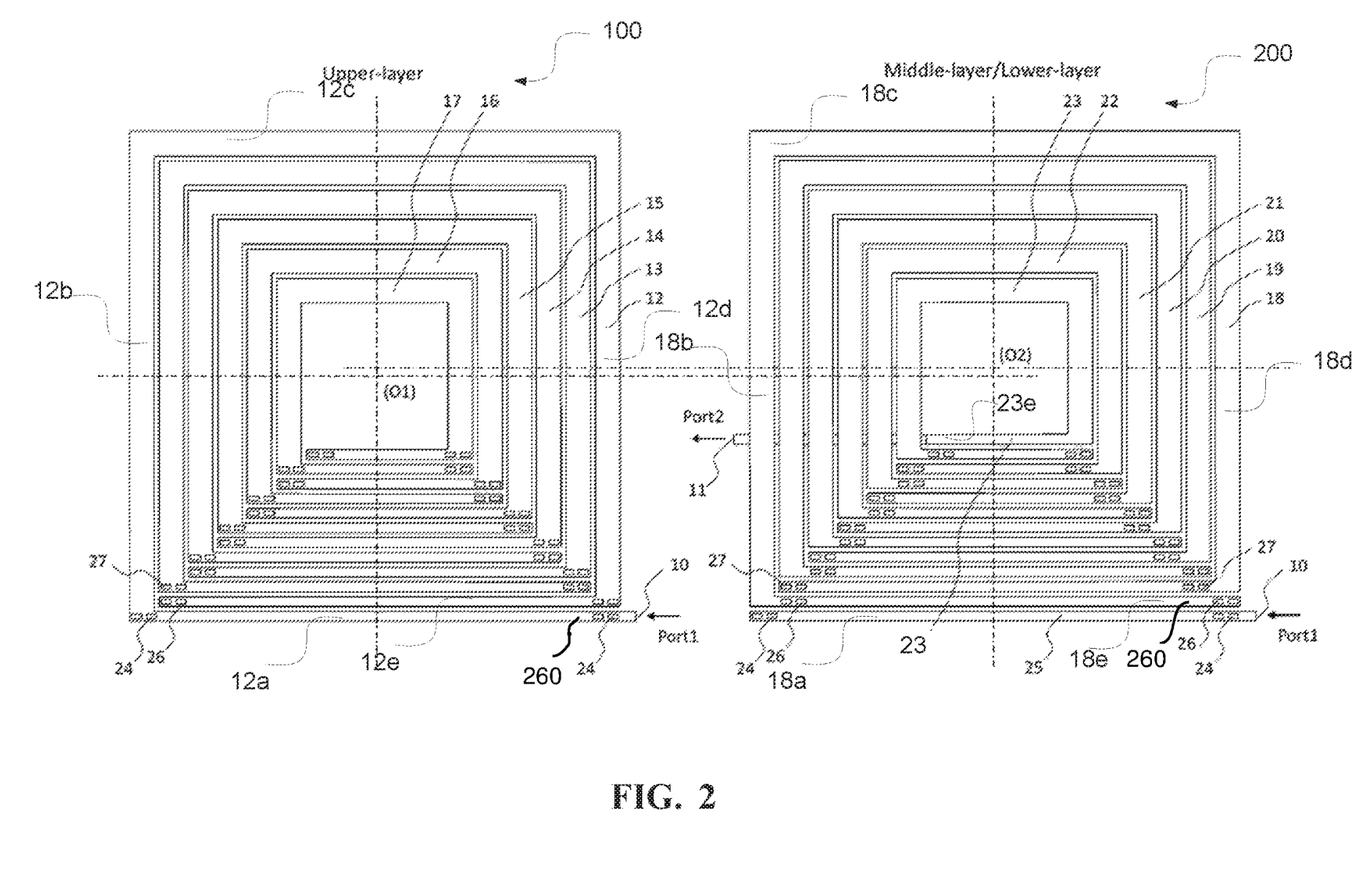
FIG. 2 shows the plan views of the upper layer layout and the middle-layer, bottom-layer layout used for making a twelve-turn inductor coil according to an embodiment of the invention.

As shown in FIG. 2, a first winding 100 may be located on the first conductive layer, for example, the upper layer, and a second winding 200, for example, on the middle layer. The geometric central points of the first winding 100 and the second winding 200 are not spatially aligned. FIG. 2 shows that each of the first winding 100 and the second winding 200 includes a plurality of conductive loops. In other words, the geometric central point of a conductive loop of at least one layer is not spatially aligned with the geometric central point of a conductive loop of the upper layer or/and lower layer which is adjacent to the upper layer or/and lower layer mentioned above. The conductive loop can be spiral loops, the width of the loops can be different. Winding means wires or conductor which constitutes the coil. The hole in the center of the coil is called the core area, a magnetic axis or the geometric central point, which is represented as O1 or O2 in FIG. 2. Each loop of wire is called a turn. In windings in which the turns touch, the wire must be insulated with a coating of nonconductive insulation such as plastic or enamel to prevent the current from passing between the wire turns. The ends of the wire are brought out and attached to an external circuit.

A third layer in addition to the upper layer and the middle layer, for example, the lower layer may comprise bridge configured to connect the inner spiral loop of the upper layer to the second terminal electrode. The third layer may or may not contain a plurality of conductive loops.

An inductive device is provided in an embodiment of the invention, at least comprises a plurality of windings as described above, wherein the plurality of windings are connected together in series in order to form a single inductive device.

Alternatively or additionally, a circuit comprises at least one inductor device or a plurality of windings as describe above.

Alternatively or additionally, a method of preparing a coil, comprises forming a plurality of conductive layers, wherein a first conductive layer and a second conductive layer of the plurality of conductive layers each comprises a winding, and the first conductive layer is adjacent to the second conductive layer; electrically connecting a first winding on the first conductive layer to a second winding on the second conductive layer; connecting a first end of the first winding to a first terminal electrode, and connecting a second end on the second winding to a second terminal electrode; wherein geometric central points of the first winding and the second winding are not spatially aligned.

The winding of an embodiment of the invention may be used for making any inductive device, alternatively used for making an inductor or a transformer.

Embodiment 1

Figure 1:
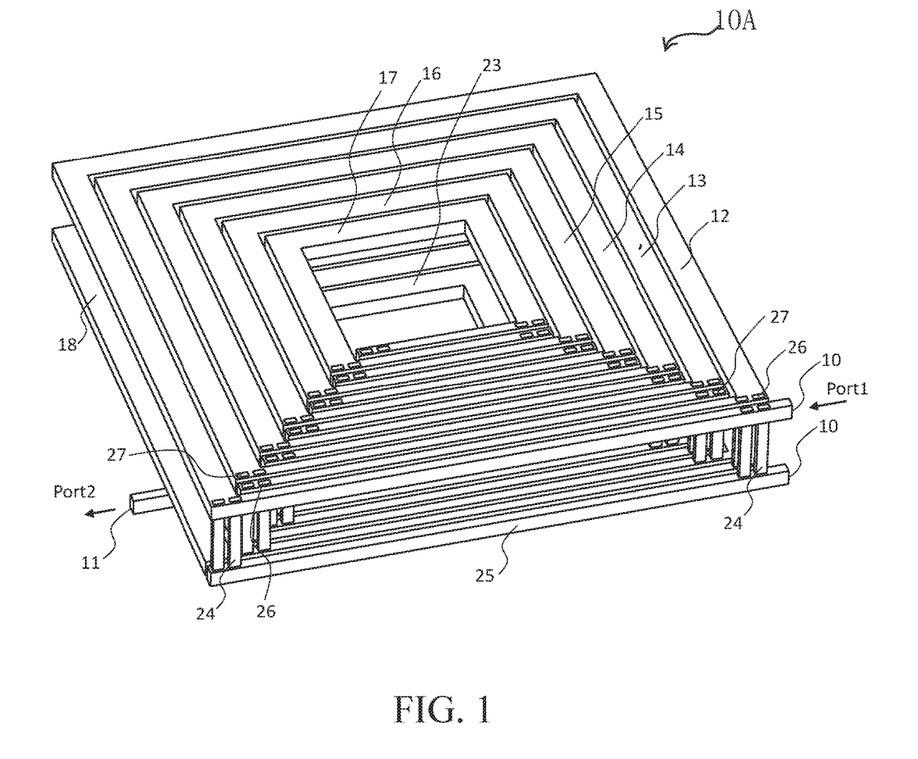
FIG. 1 is three dimensional view of a twelve-turn inductor layout used for making an inductor according to an embodiment of the invention.

An embodiment of the present invention will now be described with reference to the accompanying drawings. FIG. 1 shows three dimensional view of an embodiment of the present invention. FIG. 2 shows the associated layout plan views of the upper layer, the middle and lower layers at the left and right sides, respectively. The coil 100A may include a plurality of conductive layers. A conductive layer may include N conductive loops, and its adjacent conductive layer may include N−1 or N+1 conductive loops.

As shown in FIG. 1, the coil 100A includes 3 conductive layers. The upper layer has six conductive spiral loops. All of the six conductive spiral loops have the same shape but different sizes, and they are in a nested manner; the middle layer has 6 conductive spiral loops, the 6 conductive spiral loops have the same shape but different sizes, and they are in a nested manner. The lower layer contains a bridge (not shown in FIG. 1 or 2) that connects the inner loop of the middle layer to a second terminal electrode 11. Note that the bridge can also be included in the middle or top layer, such that the coil 100A may only use two conductive layers to achieve the same features. A first terminal electrode 10 is electrically connected to the outer loop 12 of the upper layer, and a second terminal electrode 11 is electrically connected to the inner loop 23 of the middle layer. The conductive spiral loops may all be of square in shape. The inductor coil comprises in total 12 turns, which comprises six turns on the upper conductive layer and six turns on the middle conductive layer.

Alternatively or additionally, the thickness of the 3 adjacent conductive layers in FIG. 2 are equal. Further, the spacing between two adjacent conductive spiral loops of a same layer are the same as the spacing between two adjacent conductive spiral loops of an adjacent layer. Each conductive spiral loop is insulated from one another through an insulating material. Conductive spiral loops are interconnected using conductive metal-filled via plugs or metal-filled vias.

Figure 8:
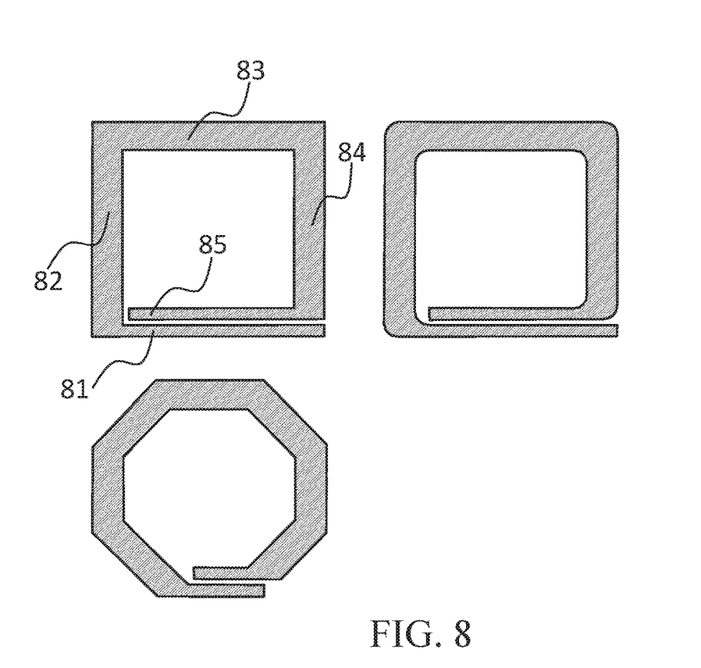
FIG. 8 shows a schematic view illustrating the electric loops of two adjacent lines electrically connected in series.

FIG. 8 shows one conductive spiral loop. The conductive spiral loops of the winding are in a similar shape of square, blended square, octagon, polygon, circle or simple closed curve. As shown in FIG. 8, the shape of conductive loops can be square, it can be divided into 5 conductive section traces 81, 82, 83, 84, 85. The section traces are made of metal traces. The metal can be gold, copper, aluminum and so on. The last end section trace 85 is placed in parallel with the first end section trace 81. The last end section trace 85 flips over the first end section trace 81. The first and last end section traces are separated by a unit of spacing. The five section traces can be divided into 2 groups. The first group includes 3 section traces 82, 83, 84, wherein each section trace features have the same trace width. The second group includes 2 end section traces 81 and 85, which have the same trace width but it is narrower than the width of those of the first group.

The first or/and the last end section traces of each of the 6 conductive loops in upper layer are used to inter-connect with a corresponding one of the other 6 conductive loops in the middle layer in a nested manner via plugs or holes so as to form an inductor coil, wherein the plugs or holes is filled with metal such as gold, copper, aluminum. In other words, conductive loops in the two adjacent layers are inter-connected together, for example, via cross bridge or conductive vias. Note the interconnected conductive loops may have same shape but different sizes.

Further, the 3 section traces 12b, 12c, and 12d of the spiral loop 12 are in face-to-face with the 3 section traces 18b, 18c and 18d of the spiral loop 18. Further, in the same manner, the 3 section traces of the spiral loops 13 are in face-to-face with the 3 section traces of the spiral loop 19. The 3 section traces of the spiral loops 14 are in face-to-face with the 3 section traces of the spiral loop 20. The 3 section traces of the spiral loops 15 are in face-to-face with the 3 section traces of the spiral loop 21. The 3 section traces of the spiral loops 16 are in face-to-face with the 3 section traces of the spiral loop 22. Finally, the 3 section traces of the spiral loops 17 are in face-to-face with the 3 section traces of the spiral loop 23.

As a consequence, the geometric central point (O1) of the conductive spiral loops 12, 13, 14, 15, 16, 17 of the upper layer is not spatially aligned with the geometric central point (O2) of the conductive spiral loops 18, 19, 20, 21, 22, 23 of the middle layer (that is, the orthogonal projection of the geometric central point of one lower layer's conductive spiral loop to the upper layer does not overlap with the geometric central point of one upper layer's conductive spiral loop, or the geometric central point of one lower layer's conductive spiral loop to the upper layer is offset from the geometric central point of one upper layer's conductive spiral loop).

The first end section trace of the outer spiral loop 12 located in the upper layer is connected to the first terminal electrode 10. In order to reduce the series resistance related to the first end section trace of the outer spiral loop, a distinct and single section trace 25 is located in the middle layer, which is placed in parallel and inter-connected to the first end section trace of the outer spiral loop 12 using metal filled vias.

The last end section trace 23e of the inner loop 23 located in the middle layer is connected to the second terminal electrode 11 using a distinct and single bridge section trace located in the lower layer. Such that, the first end section trace 12a of conductive spiral loop 12 is connected with the first terminal electrode 10, the last end section trace 12e of the conductive spiral loop 12 is connected with the first end section traces 18a of the conductive spiral loop 18 via plugs or holes. The last end section trace 18e of 18 is connected with the first end section traces of the conductive spiral loop 13 via plugs or holes, the last end section trace of 13 is connected with the first end section trace of the conductive spiral loop 19 via plugs or holes, the last end section traces of the conductive spiral loop 19 is connected with the first end section trace of the conductive spiral loop 14 via plugs or holes, the last end section trace of the conductive spiral loop 14 is connected with the first end section trace of the conductive spiral loop 20 via plugs or holes, the last end section trace of the conductive spiral loop 20 is connected with the first end section trace of the conductive spiral loop 15 via plugs or holes, the last end section trace of the conductive spiral loop 15 is connected with the first end section trace of the conductive spiral loop 21 via plugs or holes, the last end section trace of the conductive spiral loop 21 is connected with the first end section trace of the conductive spiral loop 16 via plugs or holes, and the last end section trace of the conductive spiral loop 16 is connected with the last end section trace of the conductive spiral loop 22 via plugs or holes, and the last end section trace of the conductive spiral loop 22 is connected with the last end section trace of the conductive spiral loop 17 via plugs or holes, the last end section trace of the conductive spiral loop 17 is connected with the last end section trace of the conductive spiral loop 23 via plugs or holes, and the last end section trace of conductive spiral loop 23 is connected with the second terminal electrode 11 via the bridge in order to form a winding.

Therefore, an electrical current inputted from the first terminal electrode 10 flows through the spiral loop 12 of the upper layer, through the two pairs of conductive metal-filled via plugs 26 and reaches the spiral loop 18 of the middle layer, and flows through a two pairs of conductive metal-filled via plugs 27 and reaches the spiral loop 13 of the upper layer; the electrical current flows through the spiral loop 19 of the middle layer, and through two pairs of conductive metal-filled via plugs and reaches the spiral loop 14 of the upper layer; the electrical current flows through the spiral loop 20 of the middle layer, and through the two pairs of conductive metal-filled via plugs and reaches the spiral loop 15 of the upper layer; the electrical current flows through the spiral loop 21 of the middle layer, through the two pairs of conductive metal-filled via plugs and reaches the spiral loop 16 of the upper layer; the electrical current flows through the spiral loop 22 of the middle layer, through the two pairs of conductive metal-filled via plugs and reaches the spiral loop 17 of the upper layer; the electrical current flows through the spiral loop 23 of the middle layer, and finally flows out through the second terminal electrode 11 at the lower layer. The winding may be used for making an inductor and the like.

In this embodiment, the width of the pairs of crossover conductive metal filled via plugs does not exceed the width of an end section trace of a conductive spiral loop.

As shown in FIG. 2, from the entrance of the coil in an outer loop, current goes down (or up) after the first loop, then goes up (or down) after the second loop, then goes down (or up) after the third loop, etc., and finishes to the second terminal electrode in an inner loop. The current alternated between the loops of the upper conductive layer and the middle conductive layer.

Further, as the upper layer may contain even loops and the middle layer may contain odd loops, or vice versa, the first terminal electrode and the second terminal electrode may be connected to different loops within the same conductive layers.

Embodiment 2

Figure 3:
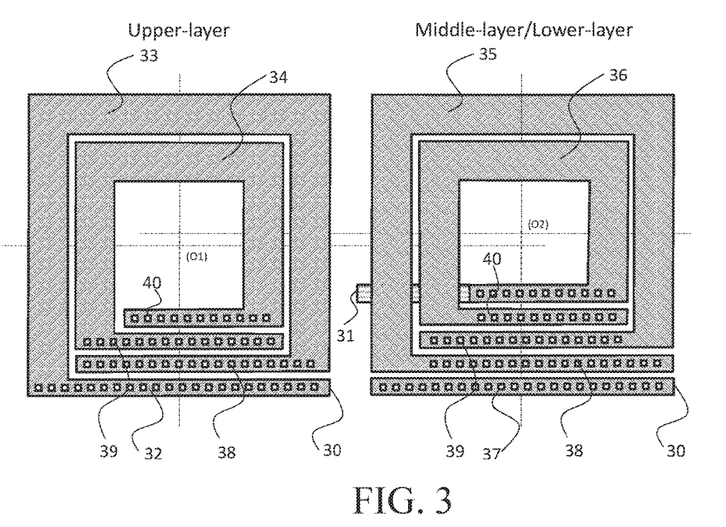
FIG. 3 shows the plan views of the upper layer layout and the lower layer layout used for making a four-turn inductor coil according to an embodiment of the invention.

As shown in FIG. 3, the inductor coil includes 3 layers, which are the upper layer, the middle layer and the lower layer. The upper layer has 2 conductive spiral loops 33, 34. The 2 conductive spiral loops 33 and 34 have the same shape but different sizes, and are in a nested manner. The middle layer has 2 conductive loops 35,36. The 2 conductive spiral loops 35 and 36 have the same shape but different sizes, and are in a nested manner as well. In an embodiment, all the conductive loops included in the winding are all conductive spiral loops. All are square in shape; the coil further contains a bridge that connects the inner loop of the middle layer to the terminal electrode 31, the bridge can be included in the lower layer. Alternatively, the bridge can also be included in the middle layer or in the top layer, so that this coil only have two layers to achieve the same features. The inductor coil comprises in total 4 turns. The spacing between two adjacent conductive spiral loops of a same layer are the same for the two adjacent layers.

Each conductive spiral loop 33,34,35,36 adopts the spiral loop of FIG. 8. Each loop is divided into 5 conductive section traces 81,82,83,84,85 as shown in FIG. 8. The last end section trace is placed in parallel of the first end section trace in a manner that the last end section trace flips over the first end section trace. The first and last end section traces are separated of a unit of spacing. The 5 section traces can be divided into 2 groups. The first group includes 3 section traces that have the same trace width. The second group includes 2 end section traces, for example, the first and the last end section traces, which also have the same width but narrower than those of the first group.

The first or/and the last end section traces of each of the 2 conductive loops in upper layer are used to inter-connect with a corresponding one of the other 2 conductive loops in the middle layer in a nested manner via plugs or holes so as to form an inductor winding, wherein the plugs or holes is filled with metal such as gold, copper, aluminum, such that the first end section trace of the conductive spiral loop 33 is connected to the first terminal electrode 30, the last end section trace of the conductive spiral loop 33 is connect with the first end section trace of 35 via plugs or holes, the last end section traces of the conductive spiral loop 35 is connect with the first end section trace of 34 via plugs or holes, the last end section trace of the conductive spiral loop 34 is connect with the first end section trace of 36 via plugs or holes, and the last end section trace of the conductive spiral loop 36 is connected to the second terminal electrode 31 using a distinct and single bridge section trace located in the lower layer in order to form a winding.

Note two conductive loops in the 2 adjacent layers which are inter-connected together, have the same shape but different sizes.

The 3 section traces of the spiral loop 33 are in face-to-face with the 3 section traces of the spiral loop 35; also, in the same manner, the 3 section traces of the spiral loop 34 are in face-to-face with the 3 section traces of the spiral loop 36.

As a consequence, the geometric central point of a conductive spiral loop of the upper layer (O1) is not spatially aligned with the geometric central point of one conductive spiral loop of the middle layer (O2) (that is, the orthogonal projection of the geometric central point of one middle layer's conductive spiral loop to the upper layer does not overlap with the geometric central point of one upper layer's conductive spiral loop).

The first end section trace of the outer spiral loop 33 located in the upper layer is connected to the first terminal electrode 30. In order to reduce the series resistance related of the first section of the outer loop, a distinct and single section 37 is located in the middle layer, is placed in parallel with and inter-connected to the first end section trace of the outer spiral loop 33 using a series of metal filled vias.

The last end section trace of the inner spiral loop 36 located in the middle layer is connected to the second terminal electrode 31 using a distinct and single bridge section located in the lower layer.

Therefore, electrical current inputted from a terminal electrode 30 flows through the spiral loop 33, through the two pairs of conductive via plugs 38 and reaches the spiral loop 35 of the middle layer, and flows through a series of conductive via plugs 39 and reaches the spiral loop 34 of the upper layer, then flows through a series of conductive via plugs 40 and reaches the spiral loop 36, and flows through the bridge of the lower layer, and finally flows out through the second terminal electrode 31. The winding may be used for making an inductor and the like.

Embodiment 3

Figure 7:
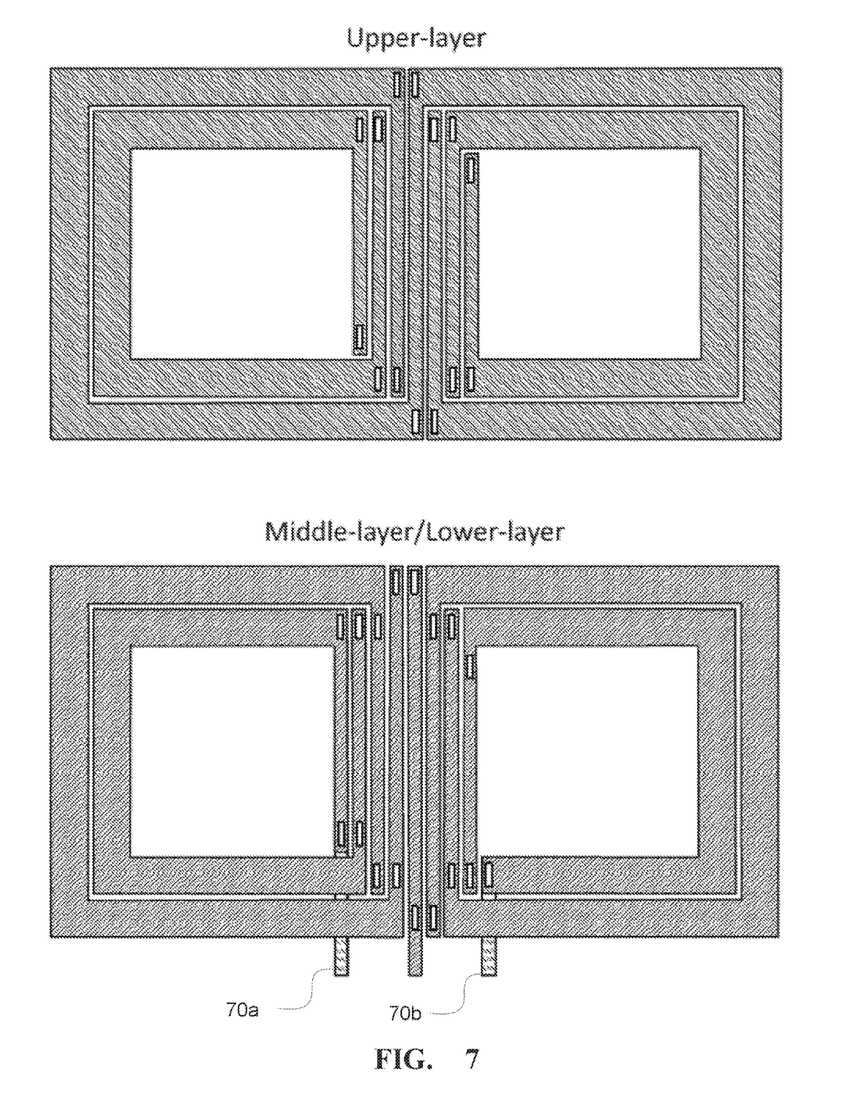
FIG. 7 shows the schematic views of the inductive loops according to an embodiment of the invention.

As shown in FIG. 7, the inductor coil comprises 2 windings which are rotated 90° clockwise and −90° counterclockwise, respectively relative to the windings shown in FIG. 2. For example, the left winding on the upper layer is rotated 90° counterclockwise relative to the windings shown in FIG. 2, and the right winding on the upper layer is rotated 90° clockwise relative to the windings shown in FIG. 2. Due to the rotation, each geometric central point of the windings is shifted at the left and right side in such a way that the windings can be connected in series. Both windings include 3 layers, which are the upper layer, the middle layer and the lower layer; both windings feature the similar design topology and similar electrical properties as the winding described in Embodiment 1 or 2. However, because of the particular rotation of windings, an electrical current is input at a first terminal electrode 70a at the left side of the inductor, then the electrical current flows anticlockwise in the left winding by alternating between the lower layer and the upper layer, and flows clockwise in the right winding by alternating between the lower layer and the upper layer. The current then outputs from the second terminal electrode 70b. The current induces a positive magnetic field in the first winding and a negative magnetic field in the second winding.

As a result, both windings have a positive mutual coupling and the total inductance value of the inductor windings is improved. In addition, this inductor has the ability to reduce or avoid mutual coupling when it is located nearby with other inductive device. Finally, a second terminal electrode can be connected in the middle of the inductive conductive path, then in the middle of the two windings, so that the inductor can have a center tap.

It should be noted that, based on the description of embodiments, persons skilled in the art should understand that embodiments are only examples instead of limiting the present invention. In fact, the shape of the conductive loops may be other shapes, such as those proposed in FIG. 8; moreover, the number of total conductive loop is not limited to 4 or 12. Other numbers, such as 6 or 14, are also available.

Figure 5:
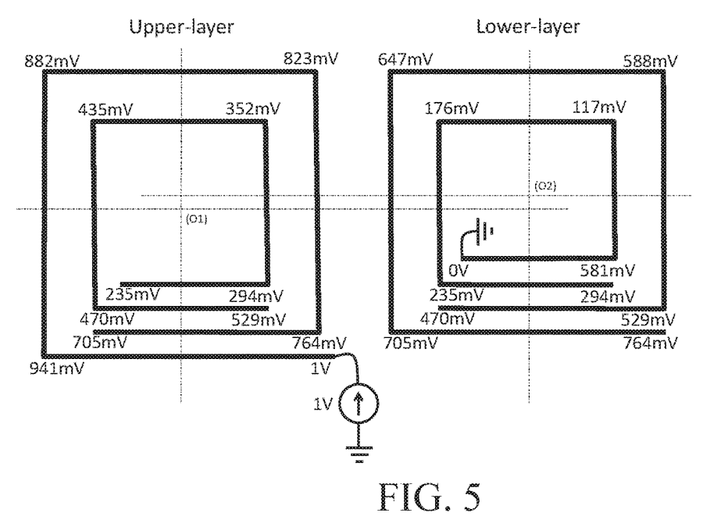
FIG. 5 shows the schematic views of the upper-layer and the lower layer layout paths used for making a four-turn inductor coil according to an embodiment of the invention of FIG. 3, which shows the distribution of the potential along the path.

FIG. 5 shows the schematic views of the upper-layer and the lower layer layout paths used for making a four-turn inductor coil according to an embodiment of the invention of FIG. 3, which shows the distribution of the voltage potential along the path. As shown in FIG. 5, same voltage potential on the upper layer and the lower layer indicates that these segments are overlapped and connected.

Figure 10:
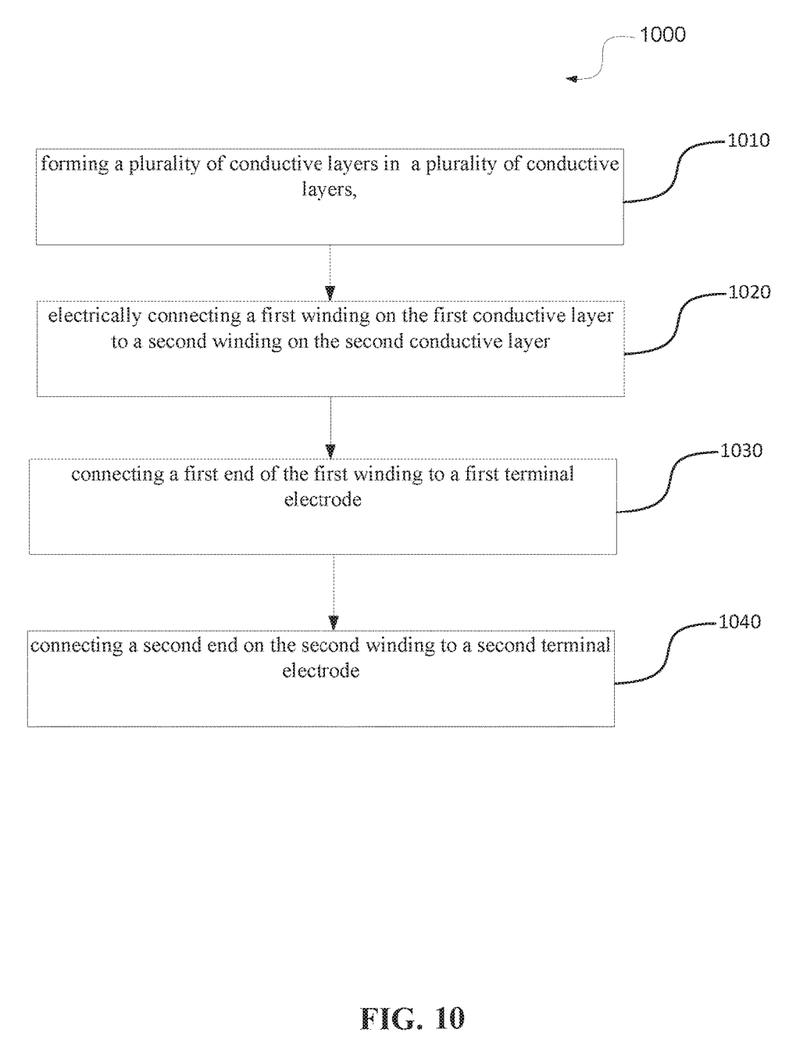
FIG. 10 is flow chart illustrating a method of preparing a coil according to an embodiment of the invention.
Figure 11:
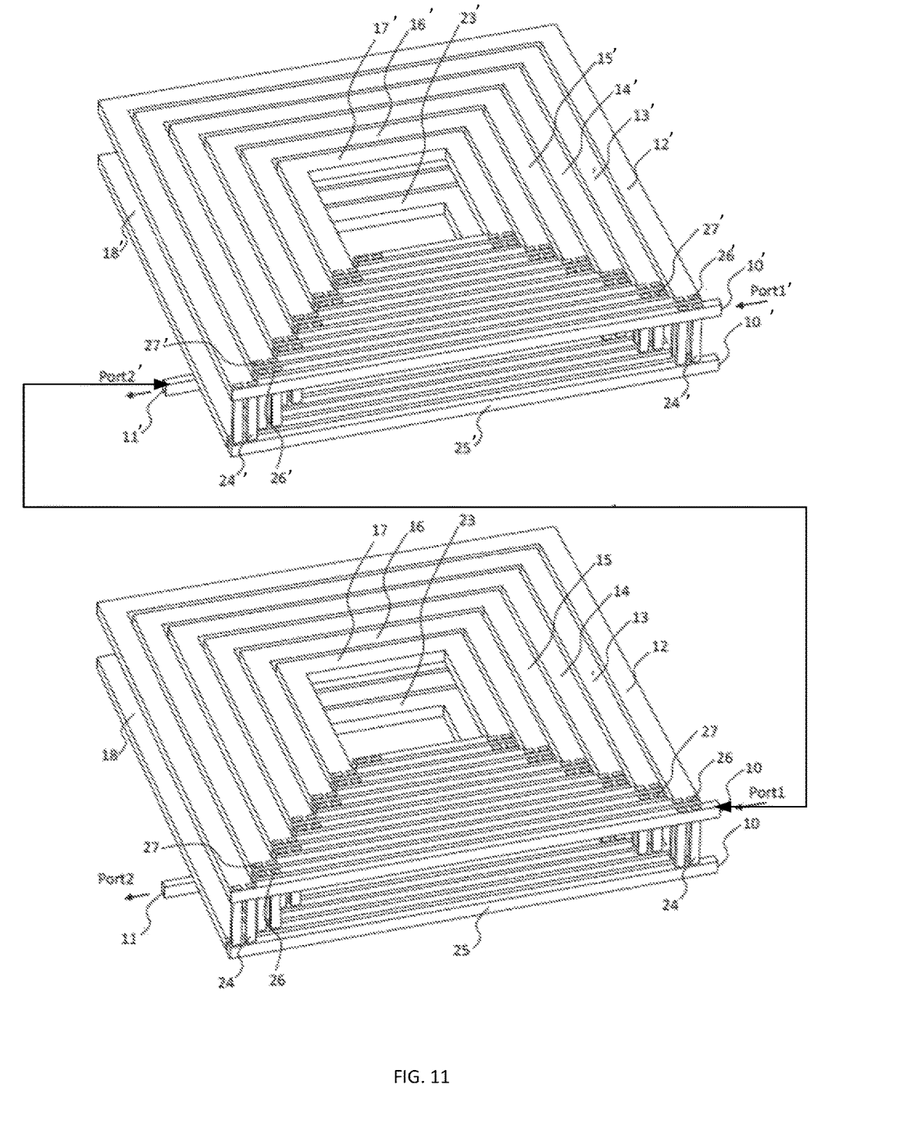
FIG. 11 shows a plurality of asymmetric coils connected in series.

FIG. 10 is flow chart illustrating a method of preparing a coil according to an embodiment of the invention.

A method 1000 of preparing a coil comprises forming a plurality of conductive layers in block 1010, wherein a first conductive layer and a second conductive layer of the plurality of conductive layers each comprises a winding, and the first conductive layer is adjacent to the second conductive layer; electrically connecting a first winding on the first conductive layer to a second winding on the second conductive layer in block 1020; connecting a first end of the first winding to a first terminal electrode in block 1030, and connecting a second end on the second winding to a second terminal electrode in block 1040; wherein geometric central points of the first winding and the second winding are not spatially aligned.

Alternatively or additionally, each of the first winding and the second winding further comprises a plurality of conductive loops, and the method further comprises isolating the plurality of conductive loops from one another using an insulating material; and forming the coil on a substrate by connecting conductive loops of adjacent conductive layers, wherein the substrate comprises a semiconductor substrate or a Printed Circuit Board (PCB).

For better understanding, both windings discussed in the embodiments, the parameters are the same, such as the thickness of conductive loops of the adjacent conductive layers has the same, the spacing of the adjacent conductive loops of the same conductive layer, and the width of spiral loop trace. But in implementation, these parameters can be different in order to optimize the self-resonance frequency or the Q-factor, and the winding can have a plurality of conductive layers, it can be 2 layers or 4 layers and so on.

It can be seen from the embodiments that the winding used as the inductor according to the embodiments of present invention has the following advantages:

i. a spiral inductor winding having a plurality of layers, wherein at least 2 layers of the plurality of layers comprises at least one conductive spiral loop, the conductive spiral loops being in a nested manner and electrically inter-connected to form a winding. As a consequence, the inductance value of the inductor is more than 2 times higher than a planar single-layer inductor winding, considering the magnetic mutual coupling effect between the adjacent loops.

ii. Because an electrical current input from the first terminal electrode follows an alternate path from the upper layer to the lower layer, to the upper layer and so on, the differential voltage between two adjacent section traces of different spiral loops of the upper layer and of the lower layer is reduced to a minimum value. As a consequence, the apparent parasitic coupling capacitance between the first terminal electrode and the second terminal electrode is reduced compared to a winding of the prior art and the performance is improved.

Therefore, based on the description of the embodiments, persons skilled in the art should understand that the above descriptions are only examples instead of limiting the embodiments of present invention. In fact, any windings having the following features are included in the scope of the present invention:

An inductor device is provided in an embodiment of the invention, at least comprises:

a plurality of windings as described above, wherein the plurality of windings are connected together in series in order to form a single inductive device.

A preparation method of a winding is provided in an embodiment of the invention, at least comprising forming the winding on a substrate, wherein conductive spiral loops are insulated with one another through an insulating material, and wherein the substrate comprises a semiconductor substrate or a Printed Circuit Board (PCB).

A spiral inductor winding having a plurality of layers, wherein at least 2 layers of the plurality of layers comprises at least one conductive loop, the conductive loops being in a nested manner and electrically interconnected to form a winding; a winding having at least 2 terminal electrodes, and at least, one terminal electrode is connected to an outer spiral loop, and at least, one terminal electrode is connected to an inner spiral loop; the geometric central point of a conductive spiral loop of at least one layer is not spatially aligned with the geometric central point of a conductive spiral loop of at least one of its adjacent layer; and at least one end section trace of the spiral loop of the upper layer is used to connect one end section of another spiral loop of the lower layer.

Technical Content

Figure 6:
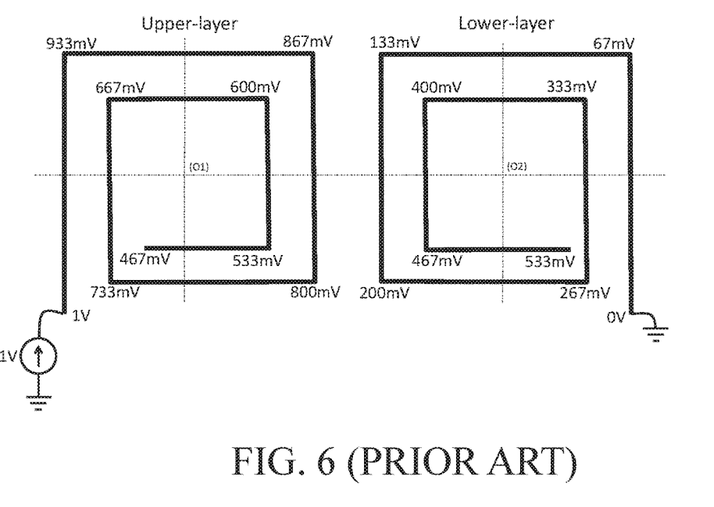
FIG. 6 shows the schematic views of the upper-layer and the lower layer layout paths used for making a two-turn inductor coil consistent with the prior art of FIG. 4, which shows the distribution of the potential along the path when the inductor coil is biased of 1V.
Figure 9:
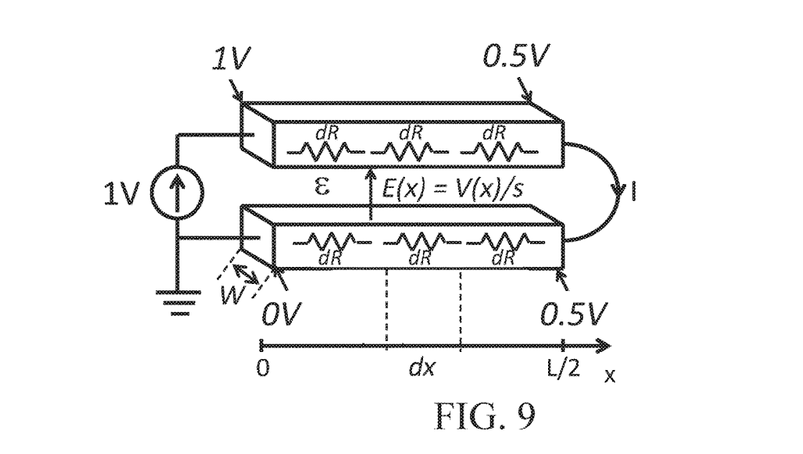
FIG. 9 is a schematic view illustrating the electric storage of two adjacent lines electrically connected in series.

To better understand, the advantages of embodiments of the present invention are detailed studied through the analysis on the parasitic coupling capacitance of the conductive loops as shown in FIGS. 5, 6 according to the circuit theory with reference to the FIGS. 5, 6 and 9 as the follows. As shown in FIG. 9, assume two ideal, uniform and conductive lines set in face-to-face and shorted at the right extremity which the two lines are separated by an insulating material of thickness s and dielectric constants and the length of each line is L/2. The width of the each line is W. Assume that the lines are purely resistive and the distribution of the resistance is uniform along the lines. This results in the linear distribution of the potential along the line. At the left side, the differential voltage between the lines is 1V whereas at the right side, the differential voltage is 0V. The differential voltage across the two lines V(x) as function of the position x can be expressed as following:

$$V(x) = \frac{-2 \cdot x}{L} + 1 \quad (1)$$

Neglecting the fringing capacitances, the capacitance value dC of a section of line dx can be expressed as following:

$$dC = \frac{\varepsilon \cdot W}{s} \cdot dx \quad (2)$$

The amount of electric energy stored by the lines Ec can be expressed as the sum of the capacitances of all the sections and the differential voltage along the line:

$$Ec = \frac{1}{2} \cdot C \cdot V^2 = \frac{1}{2} \int_0^{\frac{1}{2}} dC \cdot V(x)^2 \quad (3)$$

or, $$Ec = \frac{1}{2} \cdot \frac{\varepsilon \cdot W}{s} \cdot \frac{L}{6} \quad (4)$$

Then, the equivalent capacitance $C_{EQ}$ seen at the input terminals can be expressed as following $$C_{EQ} = \frac{\varepsilon \cdot W}{s} \cdot \frac{L}{6} 0.333 \cdot C_{f2f} \quad (5)$$

where $C_{f2f}$ is the capacitance value corresponding to the parallel plate capacitance when the lines are opened at the right extremity $$C_{f2f} = \frac{\varepsilon \cdot W}{s} \cdot \frac{L}{2} \quad (6)$$

From above description, for inductor winding in accordance with embodiments of the invention shown in FIGS. 3 and 5, assume that the inner and the outer conductive loops have ideally the same length. When a voltage of 1V is applied to the inductor winding, the differential voltage between the outer conductive loop of the upper layer and the outer conductive loop of the lower layer is constant and is equal to 0.235V (that is, 235 mV). Similarly, the differential voltage between the inner conductive loop of the upper layer and the inner conductive loop of the lower layer is constant and is equal to 0.235V.

The electric energy stored by the winding and related to the two adjacent layers can be expressed as following (the electric energy stored by the loops in a nested manner is not considered because the separation distance can vary and then be optimized)

$$Ec = \frac{1}{2} \cdot \left(\frac{3}{4} \cdot \frac{C_{f2f}}{N/2}\right) \cdot 0.235^2 + \frac{1}{2} \cdot \left(\frac{3}{4} \cdot \frac{C_{f2f}}{N/2}\right) \cdot 0.235^2 \quad (7)$$

$$C_{f2f} = \frac{\varepsilon \cdot W}{t_{IMD1}} \cdot \frac{L}{2} \quad (8)$$

where N is the number of spiral loops in a nested manner, and equal to 4 in this case, W is the loop width, L is the total length of the unwound winding, $t_{IMD1}$ is the thickness of the inter-metal dielectric (DAD) corresponding to the separation distance of the outer loop of the upper layer and the outer loop of the lower layer, which is also the distance between the inner loop of the upper layer and the inner loop of the lower layer. Note that generally $t_{IMD1}$ is fixed by the process and usually features thin value. Therefore, the equivalent capacitance related to the face-to-face coupling capacitance of the inductor can be expressed as following:

$$C_{EQ} = 0.041 \cdot C_{f2f} \quad (9)$$

Now, assume the conventional inductor winding shown in FIGS. 4 and 6. When a voltage of 1V is applied to the inductor winding, the differential voltage between the outer conductive loop of the upper layer and the outer conductive loop of the lower layer is equal to 0.8V and 0.533V, respectively at the top side and bottom side. The differential voltage between the inner conductive loop of the upper layer and the inner conductive loop of the lower layer is equal to 0.266V.

The electric energy stored by the winding and related to the 2 adjacent layers can be expressed as following:

$$Ec = \frac{1}{2} \cdot \left(\frac{3}{4} \cdot \frac{C_{f2f}}{N/2}\right) \cdot 0.800^2 + \quad (10)$$
$$\frac{1}{2} \cdot \left(\frac{1}{4} \cdot \frac{C_{f2f}}{N/2}\right) \cdot 0.533^2 + \frac{1}{2} \cdot \left(\frac{3}{4} \cdot \frac{C_{f2f}}{N/2}\right) \cdot 0.266^2$$

Therefore, the equivalent capacitance related to the coupling capacitance between 2 layers of the inductor can be expressed as following:

$$C_{EQ} = 0.302 \cdot C_{f2f} \quad (11)$$

Compared with the conventional layout as shown in FIG. 6, the coupling capacitance in the present embodiment can be obviously reduced, thus the self-resonance frequency ($f_{SR}$) as shown in the following can be obviously increased and the performances greatly improved.

$$f_{SR} = \frac{1}{2\pi \sqrt{L_S C_P}} \quad (12)$$

where $L_s$ is the inductance value of the winding and $C_p$ is the total coupling capacitance that includes the capacitance related to the face-to-face loops and to the adjacent loops located in a same layer.

The peak Q-factor is as a consequence improved.

$$Q_{Peak} = \frac{2}{3\sqrt{3}} \cdot \frac{L_S \cdot 2\pi f_{SR}}{R_S} \quad (13)$$

Obviously, the expressions of the equivalent capacitance can be generalized as a function of the number of loop N for both windings. Considering the present embodiment, the number of sections of the winding can be written as following:

$$N_{sections} = 4 \cdot N + 1 \quad (14)$$

The differential voltage related to the two adjacent conductive wires located in two close layers can be written as function of the number of turns as following:

$$V = \frac{4}{4 \cdot N + 1} \qquad (15)$$

We can observe that the differential voltage between two adjacent conductive wires decreases as a function of the number of the turns. The electric energy stored by the inductor winding can be expressed as function of the number of turns as following:

$$Ec = \sum_{i=1}^{N} \frac{1}{2} \cdot \frac{3}{4} \cdot \frac{C_{f2f}}{N/2} \cdot \left(\frac{4}{4 \cdot N + 1}\right)^2 \qquad (16)$$
$$= \frac{1}{2} \cdot C_{f2f} \cdot \frac{12}{(4 \cdot N + 1)^2}$$

Finally, the capacitance as a function of the number of turns can be deduced as following:

$$C_{EQ} = C_{f2f} \cdot \frac{12}{(4 \cdot N + 1)^2} \qquad (17)$$

Concerning the conventional inductor winding shown in FIG. 6, the number of sections can be written as following:

$$N_{sections} = 4 \cdot N - 1 \qquad (18)$$

Then, the electric energy stored by the inductor winding can be expressed as function of the number of turns as following:

$$Ec = \sum_{i=1}^{N/2} \frac{1}{2} \cdot \frac{3}{4} \cdot \frac{C_{f2f}}{N/2} \cdot \left(\frac{8 \cdot i - 4}{4 \cdot N - 1}\right)^2 + \frac{1}{2} \cdot \frac{1}{4} \cdot \frac{C_{f2f}}{N/2} \cdot \left(\frac{8 \cdot i - 8}{4 \cdot N - 1}\right)^2 \qquad (19)$$

Finally, the equivalent capacitance can be compacted as following:

$$C_{EQ} = C_{f2f} \cdot \frac{1}{3} \cdot \frac{(4 \cdot N + 1) \cdot (4 \cdot N - 4)}{(4 \cdot N - 1)^2} \qquad (20)$$

The parasitic coupling capacitance between the conductive loops of the upper layer and the conductive loops of the lower layer, according to the present embodiment, such as shown in FIGS. 3 and 5, decreases compared with prior art inductor windings shown in FIGS. 4 and 6. With the increase of number of turns of the windings, the parasitic coupling capacitance increases and reaches a constant value Therefore, the embodiments of the invention effectively overcomes defects in the prior art and has high industrial utilization value.

The above descriptions of the detailed embodiments are only to illustrate the principle and the efficacy of embodiments of the invention, and it is not to limit the scope of the present invention. Any person skilled in the art can modify or change the embodiments without departing from the spirit and scope of the present invention. Accordingly, all equivalent modifications and variations completed by persons of ordinary skill in the art, without departing from the spirit and technical idea of the present invention, should fall within the scope of the present invention defined by the appended claims.

What is claimed is:

1. An asymmetric coil comprising:
   a plurality of conductive layers, wherein a first conductive layer of the plurality of conductive layers comprises a plurality of first conductive loops and a second conductive layer of the plurality of conductive layers comprises a plurality of second conductive loops;
   wherein the length of each of the first conductive loops is different from each other, and the length of each of the second conductive loops is different from each other; wherein
   each of the plurality of first conductive loops is electrically connected to a corresponding one of the plurality of second conductive loops, wherein shapes of each of the plurality of first conductive loops and the plurality of second conductive loops are spiral;
   each of the plurality of first conductive loops and the plurality of the second conductive loops includes a middle-section trace and two end-section traces at opposite ends of the middle-section trace, wherein for each conductive loop of the plurality of first conductive loops and the plurality of the second conductive loops, a width of the end-section traces is narrower than a width of the middle-section trace, and the sum of the widths of the two end-section traces and the spacing between the two end-section traces is not equal to the width of the middle-section trace;
   a first end-section trace of an outermost loop of the asymmetric coil is connected to a first terminal electrode, and
   a second end-section trace of an innermost loop of the asymmetric coil is connected to a second terminal electrode;
   wherein the outermost loop connected to the first terminal electrode and the innermost loop connected to the second terminal electrode belong to different conductive layers;
   wherein each end-section trace of each of the plurality of first conductive loops is electrically connected to a corresponding end-section trace of a corresponding one of the plurality of the second conductive loops when each of the end-section traces of each of the plurality of first conductive loops is facing the corresponding one of the plurality of the second conductive loops; and
   wherein geometric central points of the first conductive layer and the second conductive layer are not spatially aligned; and
   wherein each of the plurality of first conductive loops and the plurality of the second conductive loops is more than one turn and less than two turns.

2. The asymmetric coil of claim 1, wherein each of the first plurality of first conductive loops and the plurality of the second conductive loop is electrically insulated from one another using an insulating material.

3. The asymmetric coil of claim 1, wherein
   at least the first second conductive layer further comprises a single section trace placed in parallel with and inter-connected to a first end-section trace of the an outermost loop of the second first conductive layer using at least one plug or at least one metal-filled via hole.

4. The asymmetric coil of claim 1 further comprising
   a conductive bridge configured to connect the first end-section trace of a first the outermost loop of the asymmetric coil to the first terminal electrode, or to connect the second end-section trace of a first the innermost loop of the asymmetric coil to the second terminal electrode.

5. The asymmetric coil of claim 1, the first plurality of first conductive loops and the plurality of the second conductive loop are in a similar shape of square, blended square, octagon, polygon, circle or simple closed curve with one another, wherein the inner trace of loop flips over the outer trace of the spiral loop.

6. The asymmetric coil of claim 1, wherein the plurality of first conductive loops comprises N conductive loops and the plurality of second conductive loops comprises N, N−1 or N+1 conductive loops.

7. The asymmetric coil of claim 1,
wherein a width of each of the first plurality of first conductive loops and the plurality of the second conductive loop is different from each other.

8. An inductor device comprising a plurality of the asymmetric coils as in claim 1, wherein the plurality of asymmetric coils are connected in series to form an inductive device.

9. A method of manufacturing an asymmetric coil, comprising
forming a plurality of conductive layers, wherein a first conductive layer of the plurality of conductive layers comprises a plurality of first conductive loops and a second conductive layer of the plurality of conductive layers comprises a plurality of second conductive loops, wherein each of the plurality of first conductive loops and the plurality of the second conductive loops is more than one turn and less than two turns, and wherein the length of each of the first conductive loops is different from each other, and the length of each of the second conductive loops is different from each other;
electrically connecting each of the plurality of first conductive loops to a corresponding one of the plurality of second conductive loops, wherein shapes of each of the plurality of first conductive loops and the plurality of second conductive loops are spiral;
wherein each of the plurality of first conductive loops and the plurality of the second conductive loops includes a middle-section trace and two end-section traces at opposite ends of the middle-section trace, wherein for each conductive loop of the plurality of first conductive loops and the plurality of the second conductive loops, a width of the end-section traces is narrower than a width of the middle-section trace, and the sum of the widths of the two end-section traces and the spacing between the two end-section traces is not equal to the width of the middle-section trace;
connecting a first end-section trace of an outermost loop of the asymmetric coil to a first terminal electrode, and
connecting a second end-section trace of an innermost loop of the asymmetric coil to a second terminal electrode; and
wherein the outermost loop connected to the first terminal electrode and the innermost loop connected to the second terminal electrode belong to different conductive layers; and
wherein each end-section trace of each of the plurality of first conductive loops is electrically connected to a corresponding end-section trace of a corresponding one of the plurality of the second conductive loops when each of the end-section traces of each of the plurality of first conductive loops is facing the corresponding one of the plurality of the second conductive loops; and
wherein geometric central points of the first conductive layer and the second conductive layer are not spatially aligned.

10. The method of claim 9, wherein the method further comprises
separating each of the first plurality of first conductive loops and the plurality of the second conductive loops from one another using an insulating material; and
forming the asymmetric coil on a substrate by connecting one of the first plurality of first conductive loops and a corresponding one of the plurality of the second conductive loops, wherein the substrate comprises a semiconductor substrate or a Printed Circuit Board (PCB).

* * * * *